(12) United States Patent
Tsuruda et al.

(10) Patent No.: US 12,300,526 B2
(45) Date of Patent: *May 13, 2025

(54) SUBSTRATE PROCESSING CONTROL METHOD, SUBSTRATE PROCESSING APPARATUS AND STORAGE MEDIUM

(71) Applicant: TOKYO ELECTRON LIMITED, Tokyo (JP)

(72) Inventors: Toyohisa Tsuruda, Koshi (JP); Yoshitaka Konishi, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/511,594

(22) Filed: Nov. 16, 2023

(65) Prior Publication Data
US 2024/0087928 A1    Mar. 14, 2024

Related U.S. Application Data

(63) Continuation of application No. 17/021,373, filed on Sep. 15, 2020, now Pat. No. 11,862,496.

(30) Foreign Application Priority Data

Sep. 25, 2019 (JP) ................... 2019-174088

(51) Int. Cl.
*H01L 21/67* (2006.01)
*H01L 21/68* (2006.01)

(52) U.S. Cl.
CPC .. *H01L 21/67276* (2013.01); *H01L 21/67248* (2013.01); *H01L 21/681* (2013.01)

(58) Field of Classification Search
CPC ....... A44C 7/002; A61B 3/102; A61B 3/1225; A61F 2009/00851; A61F 2009/00863;
(Continued)

(56) References Cited

U.S. PATENT DOCUMENTS

2001/0016225 A1* 8/2001 Ogata ............... H01L 21/67253
118/712
2002/0168191 A1* 11/2002 Fukuda ............. H01L 21/67253
396/611
(Continued)

FOREIGN PATENT DOCUMENTS

| CN | 1020160100234 A | 8/2016 |
|----|------------------|--------|
| JP | 2008300777 A | 12/2008 |
| JP | 2009-267144 A | 11/2009 |

*Primary Examiner* — Kidest Bahta
(74) *Attorney, Agent, or Firm* — Nath, Goldberg & Meyer; Jerald L. Meyer; Tanya E. Harkins

(57) ABSTRACT

A substrate processing control method in a substrate processing apparatus, includes: acquiring a data set for each substrate sequentially subjected to first and second processes at first and second levels, the data set including information specifying the first level at which the first process has been performed, information specifying the second level at which the second process has been performed and information about a characteristic amount relating to characteristics of the substrate; calculating information including an expected value of the characteristic amount, and level deviations of the first and second levels to the expected value based on the data set, and correcting the first parameter at the first level or the second parameter at the second level based on the calculated information.

19 Claims, 14 Drawing Sheets

(58) Field of Classification Search
CPC .............. A61F 2009/00878; A61F 9/00; A61F 9/00823; A61N 2005/0627; A61N 2005/0628; A61N 2005/0659; A61N 5/0613; A61N 5/0622; B22F 2998/10; B22F 3/02; B22F 3/10; B29B 13/00; B29B 13/025; B29K 2027/06; B29L 2023/001; B29L 2023/22; C08F 14/06; C08F 14/16; C08F 2500/17; C08F 8/20; C08F 8/22; C08L 27/24; C22C 1/0433; C22C 19/07; C22C 27/04; C22C 30/00; F16L 47/30; F16L 9/12

See application file for complete search history.

(56) References Cited

U.S. PATENT DOCUMENTS

| | | |
|---|---|---|
| 2005/0060103 A1 | 3/2005 | Chamness |
| 2008/0086228 A1 | 4/2008 | Yamaji et al. |
| 2010/0224121 A1* | 9/2010 | Klingel ............... B05C 11/1034 118/63 |
| 2012/0029856 A1 | 2/2012 | Cohen et al. |
| 2012/0035863 A1* | 2/2012 | Kuwabara .......... G01N 21/9501 702/40 |
| 2018/0204720 A1 | 7/2018 | Tanaka et al. |

* cited by examiner

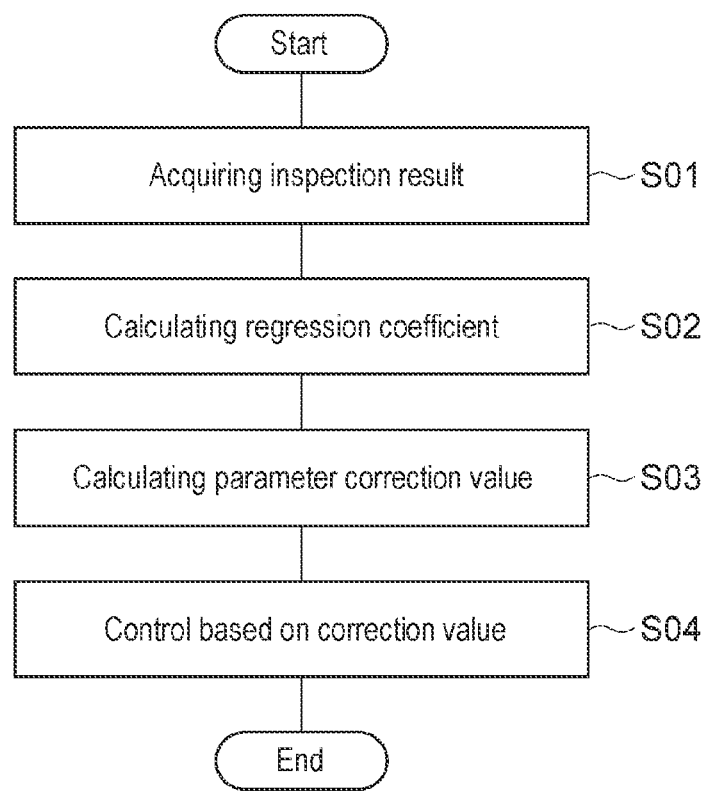

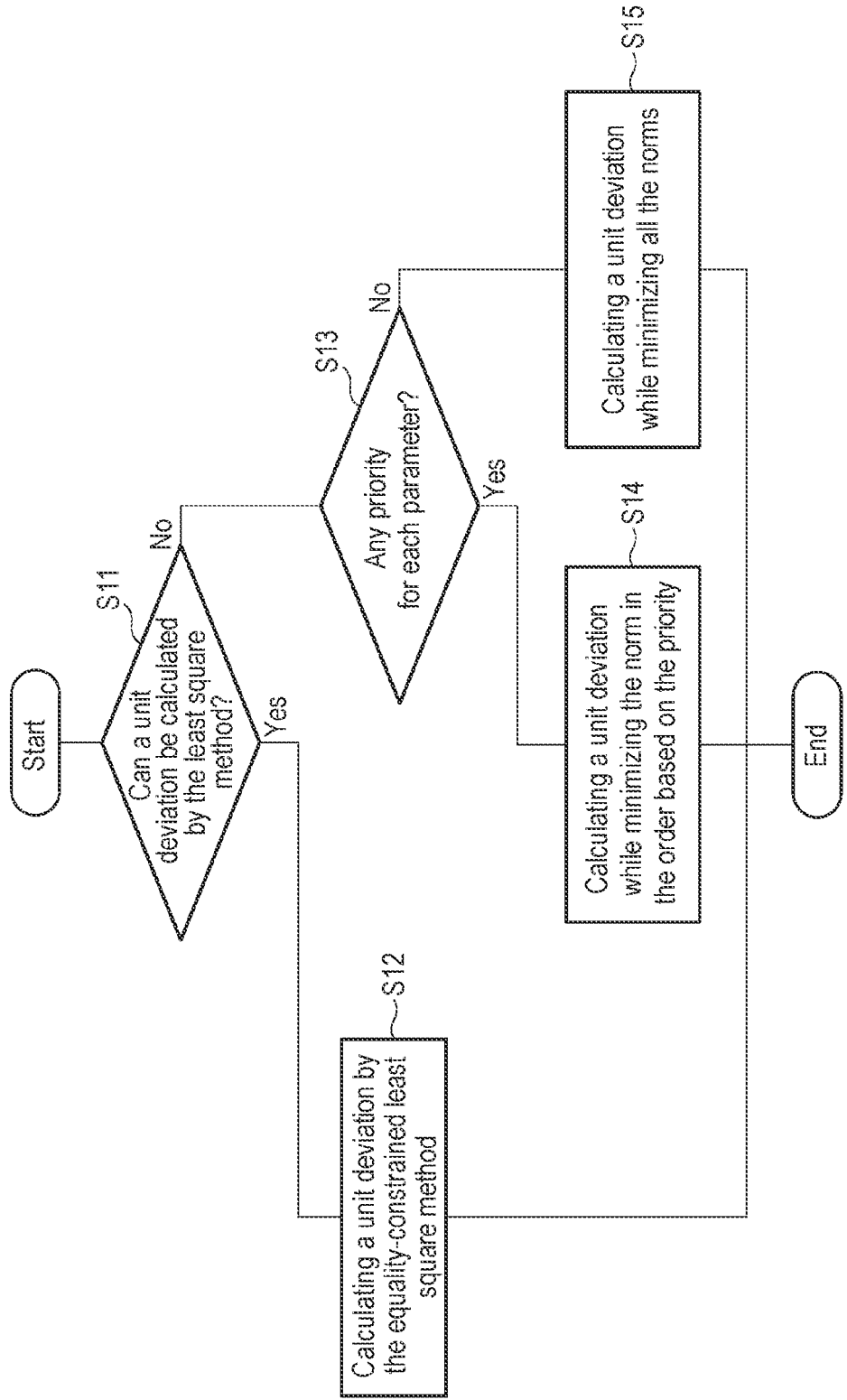

FIG. 9A

|      | PAB1 | PAB2 | PAB3 | PAB4 |
|------|------|------|------|------|
| COT1 | 85.9 | 85.8 | 86.0 | 86.1 |
| COT2 | 85.4 | 85.3 | 85.4 | 85.0 |
| COT3 | 84.8 | 84.1 | 84.7 | 84.1 |
| COT4 | 84.4 | 84.4 | 84.2 | 84.0 |

FIG. 9B

| Total average | 84.975 | COT1 | 0.975 | PAB1 | 0.150 |
|---|---|---|---|---|---|
| | | COT2 | 0.300 | PAB2 | -0.075 |
| | | COT3 | -0.550 | PAB3 | 0.100 |
| | | COT4 | -0.725 | PAB4 | -0.175 |
| | | | | Square error | 0.420 |

FIG. 10A

| | PAB1 | PAB2 | PAB3 | PAB4 | PAB5 |
|---|---|---|---|---|---|
| COT1 | 86.3 | 85.6 | | | |
| COT2 | 84.8 | 84.4 | | | |
| COT3 | 86.3 | 85.3 | | | |
| COT4 | | | 83.6 | 84.1 | 84.4 |
| COT5 | | | 84.3 | 84.7 | 84.7 |

Set1 (COT1–COT3, PAB1–PAB2)
Set2 (COT4–COT5, PAB3–PAB5)

FIG. 10B

| Total average | | | | | | |
|---|---|---|---|---|---|---|
| 84.875 | Set1 | 0.575 | COT1 | 0.500 | PAB1 | 0.350 |
| | | | COT2 | -0.850 | PAB2 | -0.350 |
| | | | COT3 | 0.350 | | |
| | Set2 | -0.575 | COT4 | -0.267 | PAB3 | -0.350 |
| | | | COT5 | 0.267 | PAB4 | 0.100 |
| | | | | | PAB5 | 0.250 |
| | | | | | Square error | 1.333 |

FIG. 11

| Total average | 84.875 | | | |
|---|---|---|---|---|
| | COT1 | 0.730 | PAB1 | 0.695 |
| | COT2 | -0.620 | PAB2 | 0.005 |
| | COT3 | 0.580 | PAB3 | -0.580 |
| | COT4 | -0.612 | PAB4 | -0.130 |
| | COT5 | -0.078 | PAB5 | 0.020 |
| | | | COT/PAB norm | 1.572 |
| | | | COT norm | 1.278 |
| | | | PAB norm | 0.915 |
| | | | Square error | 1.333 |

FIG. 12

| Total average | 84.990 | COT1 | 0.960 | PAB1 | 0.350 |
|---|---|---|---|---|---|
| | | COT2 | -0.390 | PAB2 | -0.350 |
| | | COT3 | 0.810 | PAB3 | -0.350 |
| | | COT4 | -0.957 | PAB4 | 0.100 |
| | | COT5 | -0.423 | PAB5 | 0.250 |
| | | | | COT/PAB norm | 1.807 |
| | | | | COT norm | 1.681 |
| | | | | PAB norm | 0.663 |
| | | | | Square error | 1.333 |

SUBSTRATE PROCESSING CONTROL METHOD, SUBSTRATE PROCESSING APPARATUS AND STORAGE MEDIUM

CROSS-REFERENCE TO RELATED APPLICATION

This is a Continuation Application of U.S. patent application Ser. No. 17/021,373, filed Sep. 15, 2020, an application claiming the benefit from Japanese Application No. 2019-174088, filed Sep. 25, 2019, the contents of each of which are hereby incorporated by reference in their entirety.

TECHNICAL FIELD

The present disclosure relates to a substrate processing control method, a substrate processing apparatus, and a non-transitory computer-readable storage medium.

BACKGROUND

Patent Document 1 discloses that a resist pattern is formed on a substrate, the dimensions of the resist pattern are measured, and the treatment temperature of a heat treatment is corrected based on the measurement result. Patent Document 1 also describes that the dimensions of the resist pattern subjected to the heat treatment at the corrected treatment temperature are measured and processing conditions of an exposure process are corrected based on the measurement result.

PRIOR ART DOCUMENT

Patent Document

Patent Document 1: Japanese laid-open publication No. 2009-267144

SUMMARY

According to one embodiment of the present disclosure, there is provided a substrate processing control method in a substrate processing apparatus including a first factor including a plurality of first levels for performing a first process on a substrate based on a first parameter, and a second factor including a plurality of second levels for performing a second process on the substrate based on a second parameter, the method including: an acquisition step of acquiring a data set for each of a plurality of substrates subjected to the first process at the first level and then subjected to the second process at the second level, the data set including information specifying the first level at which the first process has been performed, information specifying the second level at which the second process has been performed and information about a characteristic amount relating to characteristics of the substrate; a calculation step of calculating information including an expected value of the characteristic amount, a level deviation of the first level with respect to the expected value and a level deviation of the second level with respect to the expected value based on the data set corresponding to each of the plurality of substrates; and a correction step of correcting the first parameter at the first level or the second parameter at the second level based on the information calculated in the calculation step.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart showing an example of control performed by the control device.

FIG. 8 is a flowchart showing an example of a method of calculating a unit deviation by the control device.

FIGS. 9A and 9B are diagrams showing an example of the inspection result and an example of the calculation result of the unit deviation.

FIGS. 10A and 10B are diagrams showing an example of the inspection result and an example of the calculation result of the unit deviation.

FIG. 11 is a diagram showing an example of the calculation result of the unit deviation.

FIG. 12 is a diagram showing an example of the calculation result of the unit deviation.

DETAILED DESCRIPTION

Figure 1:
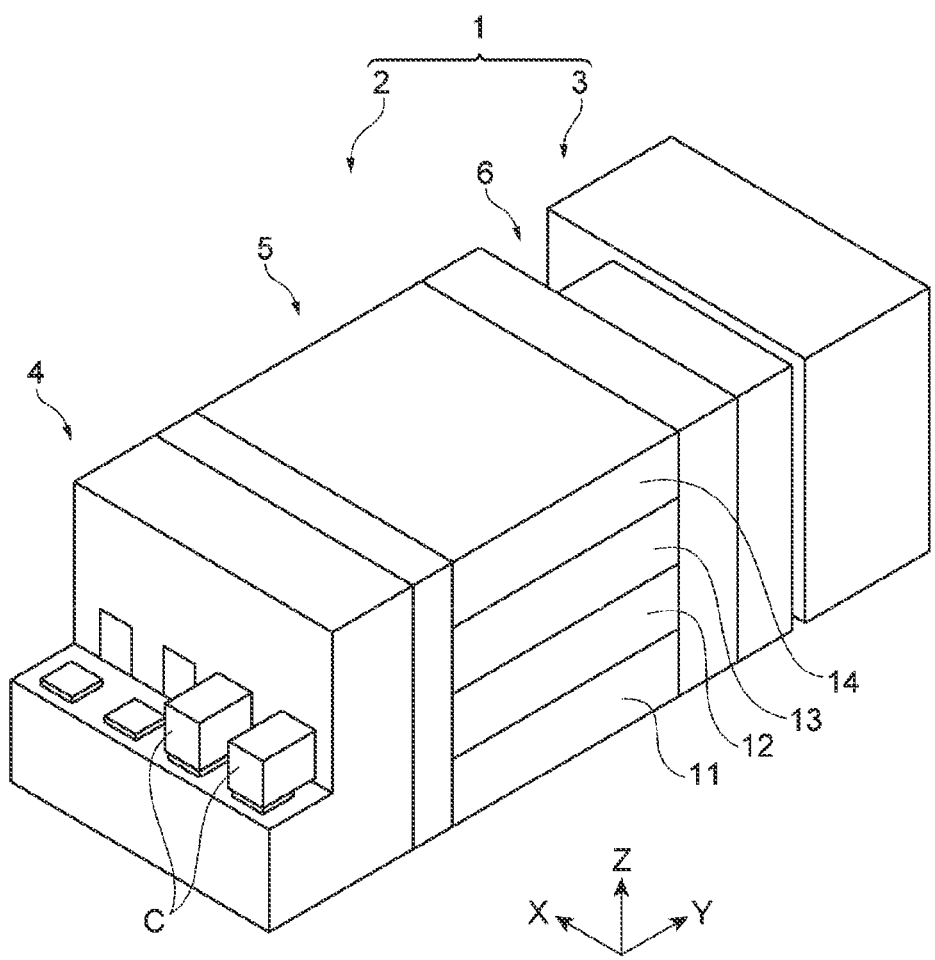
FIG. 1 is a schematic diagram showing an example of a schematic configuration of a substrate processing system.

Various exemplary embodiments will be described below. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In one exemplary embodiment, there is provided a substrate processing control method in a substrate processing apparatus that includes a first factor including a plurality of first levels for performing a first process on a substrate based on a first parameter, and a second factor including a plurality of second levels for performing a second process on the substrate based on a second parameter, the method including: an acquisition step of acquiring a data set for each of a plurality of substrates subjected to the first process at the first level and then subjected to the second process at the second level, the data set including information specifying the first level at which the first process has been performed, information specifying the second level at which the second process has been performed, and information about a characteristic amount relating to characteristics of the substrate; a calculation step of calculating information including an expected value of the characteristic amount, a level deviation of the first level with respect to the expected value, and a level deviation of the second level with respect to the expected value based on the data set corresponding to each of the plurality of substrates; and a correction step of correcting the first parameter at the first level or the second parameter at the second level based on the information calculated in the calculation step.

In the above-mentioned substrate processing control method, the data set including the information specifying the first level at which the first process has been performed, the information specifying the second level at which the second process has been performed, and the information about a characteristic amount relating to characteristics of the substrate is acquired. Then, in the calculation step, the information including the expected value of the characteristic amount, the level deviation of the first level with respect to the expected value, and the level deviation of the second level with respect to the expected value is calculated based on this data set. Furthermore, the first parameter at the first level or the second parameter at the second level is corrected based on the information thus calculated. With such a configuration, the parameters can be corrected based on the expected value of the characteristic amount and the level deviation, which are calculated for the first level and the second level. Accordingly, even if the substrates have been processed at a plurality of levels such as plural types of processing units, it is possible to appropriately correct the target value for each unit through the use of the data set including the characteristic amount of the substrate.

In the calculation step, the information including the level deviation of the first level with respect to the expected value and the level deviation of the second level with respect to the expected value may be calculated based on the data set corresponding to each of the plurality of substrates so that the norm other than the expected value of the characteristic amount based on the data set is minimized.

With the above configuration, when calculating the first level deviation at the first level and the second level deviation at the second level, the level deviations are calculated so that the norm other than the expected value of the characteristic amount is minimized. Thus, for example, even when only a data set falling within a range, in which the unit deviation for each unit cannot be calculated by the conventional method such as the least square method or the like, can be acquired, it is possible to calculate the first level deviation and the second level deviation. Accordingly, it is possible to appropriately perform the correction for each unit with respect to the expected value of the characteristic amount.

In the calculation step, when a norm minimization priority corresponding to an order of prioritizing reduction of correction values of the first factor and the second factor is predetermined for the first factor and the second factor, a unit deviation may be calculated sequentially from the factor having a higher norm minimization priority based on the data set so that the norm other than the expected value of an average value of the characteristic amounts is minimized.

When the norm minimization priority corresponding to the order of prioritizing reduction of the correction values is determined for each factor, the unit deviation is calculated sequentially from the factor having a high norm minimization priority so that the norm is minimized. With such a configuration, it is possible to prevent the factor having the high norm minimization priority from being corrected by including a unit deviation derived from another factor. Accordingly, it becomes possible to reduce the correction value for the factor having the high norm minimization priority.

In another exemplary embodiment, there is provided a substrate processing apparatus including: a plurality of first processing units configured to perform a first process on a substrate based on a first parameter; a plurality of second processing units configured to perform a second process on the substrate based on a second parameter; a characteristic amount information acquisition part configured to acquire information about characteristics of the substrate subjected to the first process in one of the plurality of first processing units and then subjected to the second process in one of the plurality of second processing units; and a controller configured to control the plurality of first processing units and the plurality of second processing units, wherein the controller is configured to: acquire a data set for each of a plurality of substrates subjected to the first process in the one of the plurality of first processing units and then subjected to the second process in the one of the plurality of second processing units from the characteristic amount information acquisition part, the data set including information specifying the first processing unit in which the first process has been performed, information specifying the second processing unit in which the second process has been performed, and information about a characteristic amount relating to the characteristics of the substrate; calculate information including an expected value of the characteristic amount, a unit deviation of the first processing unit with respect to the expected value, and a unit deviation of the second processing unit with respect to the expected value based on the data set corresponding to each of the plurality of substrates; and correct the first parameter in the first processing unit or the second parameter in the second processing unit based on the calculated information.

In another exemplary embodiment, there is provided a non-transitory computer-readable storage medium storing a program that causes an apparatus to execute the aforementioned substrate processing control method.

Various exemplary embodiments will be described below. In the description, the same elements or the elements having the same function will be designated by like reference symbols, and the redundant description thereof will be omitted.

[Substrate Processing System]

A substrate processing system 1 is a system that forms a photosensitive film on a substrate, exposes the photosensitive film, and develops the photosensitive film. The substrate to be processed is, for example, a semiconductor wafer W.

The substrate processing system 1 includes a coating/developing apparatus 2 and an exposure apparatus 3. The exposure apparatus 3 performs an exposure process on a resist film (photosensitive film) formed on the wafer W (substrate). Specifically, the exposure apparatus 3 irradiates an exposure target portion of the resist film with energy rays by a method such as liquid immersion exposure or the like. The coating/developing apparatus 2 performs a process of forming a resist film on the surface of the wafer W (substrate) before the exposure process performed by the exposure apparatus 3, and performs a developing process on the resist film after the exposure process.

[Substrate Processing Apparatus]

Figure 2:
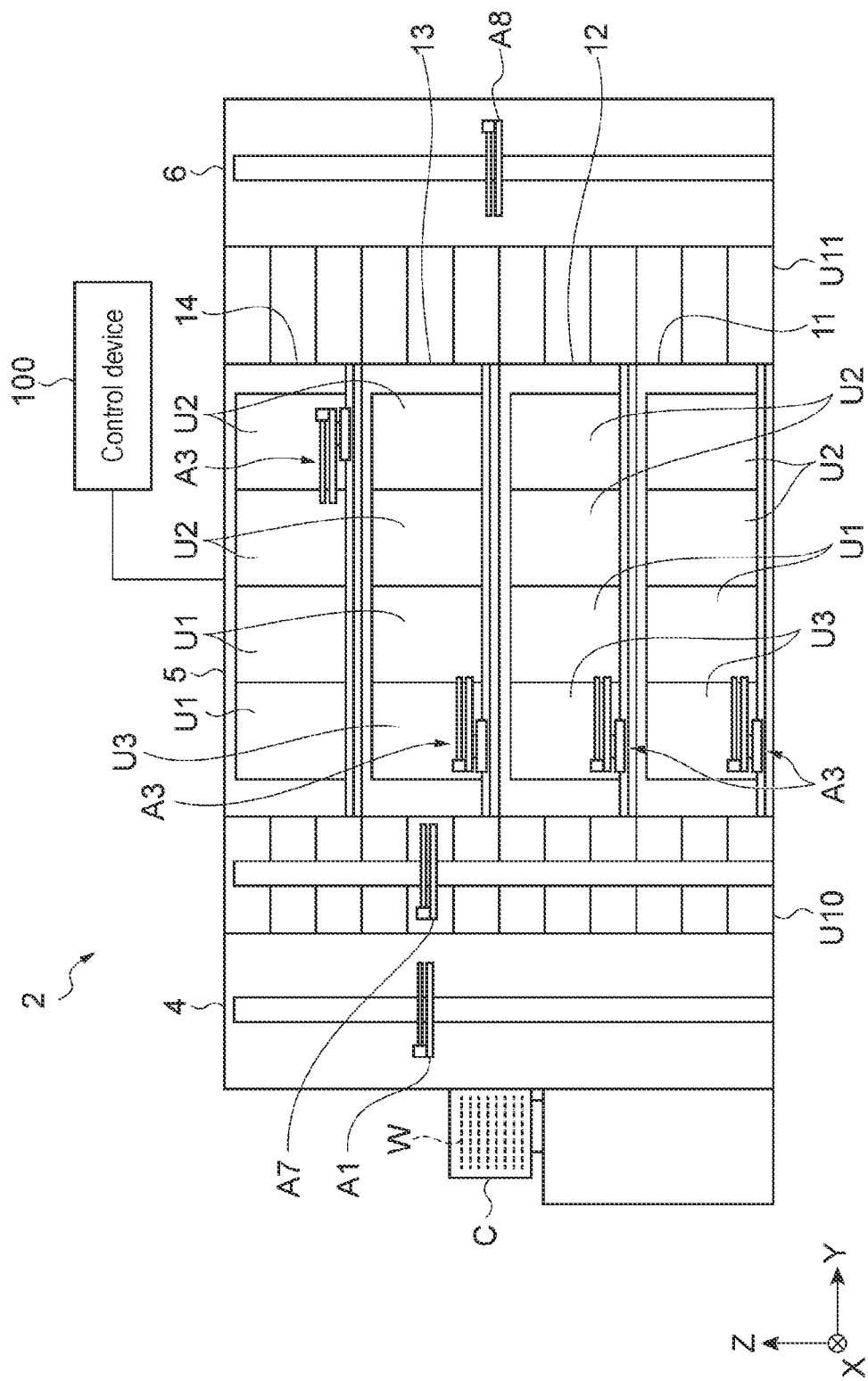
FIG. 2 is a schematic diagram showing an example of a coating/developing apparatus.

A configuration of the coating/developing apparatus 2 will be described below as an example of a substrate processing apparatus. As shown in FIGS. 1 and 2, the coating/developing apparatus 2 includes a carrier block 4, a processing block 5, an interface block 6, and a control device 100 (control part).

The carrier block 4 loads the wafer W into the coating/developing apparatus 2 and unloads the wafer W from the coating/developing apparatus 2. For example, the carrier block 4 is capable of supporting a plurality of carriers C (accommodation parts) for the wafer W and is provided with a transfer device µl including a delivery arm built therein. The carrier C accommodates, for example, a plurality of circular wafers W. The transfer device µl takes out the wafer W from the carrier C and delivers the wafer W to the processing block 5. The transfer device µl receives the wafer W from the processing block 5 and returns the wafer W into the carrier C. The processing block 5 includes a plurality of processing modules 11, 12, 13 and 14.

The processing module 11 includes a plurality of coating units U1, a plurality of heat treatment units U2, a plurality of inspection units U3, and a transfer device A3 that transfers the wafer W to these units. The processing module 11 forms a lower layer film on the surface of the wafer W using the coating unit U1 and the heat treatment unit U2. For example, the coating unit U1 of the processing module 11 coats a processing liquid for formation of the lower layer film on the wafer W while rotating the wafer W at a predetermined rotation speed. The heat treatment unit U2 of the processing module 11 performs various heat treatments associated with the formation of the lower layer film. The heat treatment unit U2 includes, for example, a heating plate and a cooling plate built therein. The heat treatment unit U2 performs a heat treatment by heating the wafer W with the heating plate to a predetermined heating temperature and cooling the heated wafer W with the cooling plate. The inspection unit U3 performs a process for inspecting the surface state of the wafer W, and acquires, for example, information about a film thickness as information indicating the surface state of the wafer W.

The processing module 12 includes a plurality of coating units U1, a plurality of heat treatment units U2, a plurality of inspection units U3, and a transfer device A3 that transfers the wafer W to these units. The processing module 12 forms a resist film on the lower layer film using the coating unit U1 and the heat treatment unit U2. The processing module 12 may be referred to as a COT module. Further, the coating unit U1 of the processing module 12 may be referred to as a COT unit. The coating unit U1 of the processing module 12 forms a coating film on the surface of the wafer W by coating a processing liquid for forming the resist film on the lower layer film. The heat treatment unit U2 of the processing module 12 performs various heat treatments associated with the formation of the resist film. The heat treatment unit U2 of the processing module 12 forms a resist film by subjecting the wafer W, on which the coating film is formed, to a heat treatment (PAB: Pre Applied Bake) at a predetermined heating temperature. The inspection unit U3 performs a process for inspecting the surface state of the wafer W. and acquires, for example, information about a film thickness as information indicating the surface state of the wafer W.

The processing module 13 includes a plurality of coating units U1, a plurality of heat treatment units U2, a plurality of inspection units U3, and a transfer device A3 that transfers the wafer W to these units. The processing module 13 forms an upper layer film on the resist film using the coating unit U1 and the heat treatment unit U2. For example, the coating unit U1 of the processing module 13 coats a liquid for forming the upper layer film on the resist film while rotating the wafer W at a predetermined rotation speed. The heat treatment unit U2 of the treatment module 13 performs various heat treatments associated with the formation of the upper layer film. The inspection unit U3 performs a process for inspecting the surface state of the wafer W, and acquires, for example, information about a film thickness as information indicating the surface state of the wafer W.

The processing module 14 includes a plurality of coating units U1, a plurality of heat treatment units U2, and a transfer device A3 that transfers the wafer W to these units. The processing module 14 develops the exposed resist film using the coating unit U1 and the heat treatment unit U2. The coating unit U1 of the processing module 14 develops the resist film, for example, by applying a developing liquid onto the surface of the exposed wafer W while rotating the wafer W at a predetermined number of rotations, and then rinsing the wafer W with a rinsing liquid. The heat treatment unit U2 of the processing module 14 performs various heat treatments associated with the developing process. Specific examples of the heat treatment may include a heat treatment before the developing process (PEB: Post Exposure Bake), a heat treatment after the developing process (PB: Post Bake), and the like.

A shelf unit U10 is provided in the processing block 5 on the side of the carrier block 4. The shelf unit U10 is divided into a plurality of cells arranged in a vertical direction. A transfer device A7 including a lifting arm is provided near the shelf unit U10. The transfer device A7 moves the wafer W up and down between the cells of the shelf unit U10.

A shelf unit U11 is provided in the processing block 5 on the side of the interface block 6. The shelf unit U11 is divided into a plurality of cells arranged in the vertical direction.

The interface block 6 delivers the wafer W to and from the exposure apparatus 3. For example, the interface block 6 is provided with a transfer device A8 including a delivery arm built therein and is connected to the exposure apparatus 3. The transfer device A8 transfers the wafer W disposed on the shelf unit U11 to the exposure apparatus 3, receives the wafer W from the exposure apparatus 3, and returns the wafer W to the shelf unit U1.

[Inspection Unit]

The inspection unit U3 included in each of the processing modules 11 to 13 will be described. The inspection unit U3 acquires information about a film thickness of the film (the lower layer film, the resist film or the upper layer film) formed by the coating unit U1 and the heat treatment unit U2. In the present embodiment, the film thickness is a kind of information relating to the characteristics of the substrate, and is used as a characteristic amount indicating the characteristics of the substrate on which the film is formed.

Figure 3:
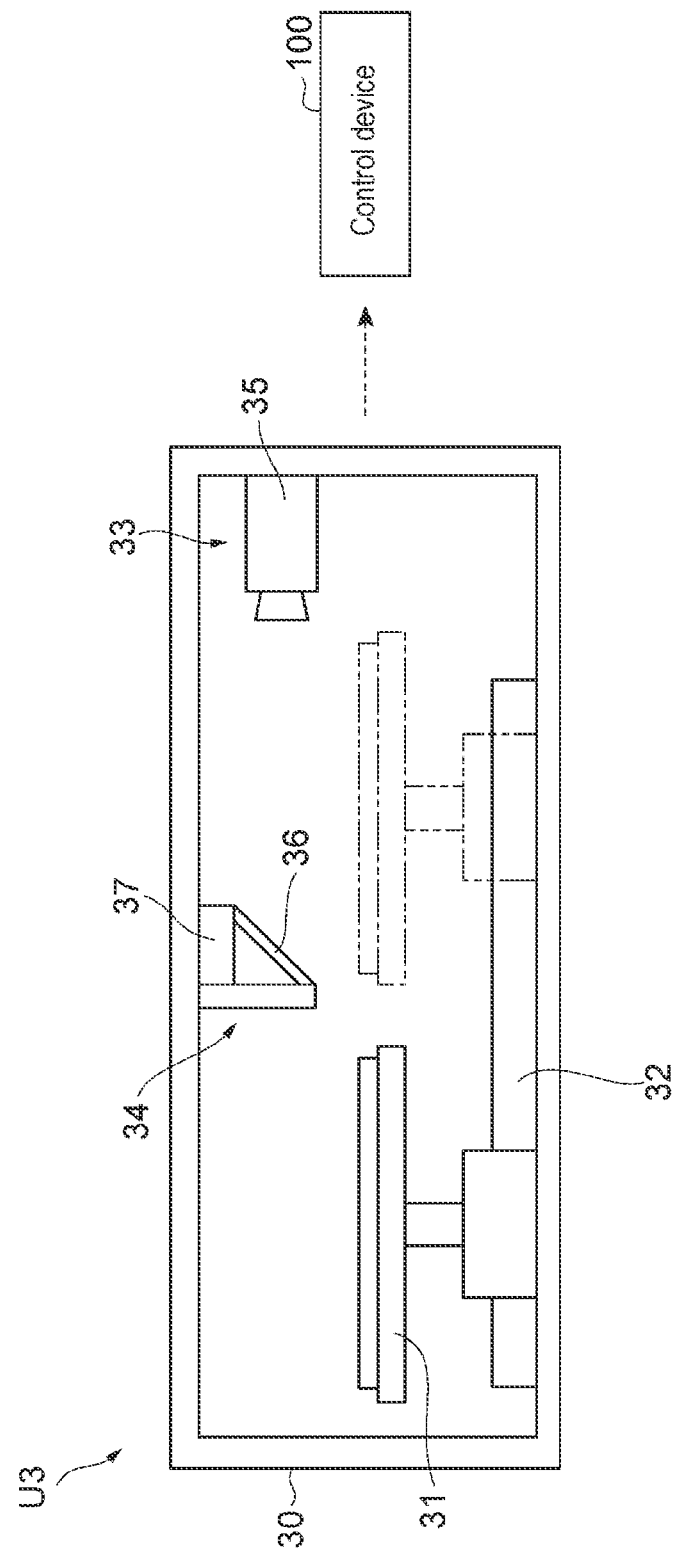
FIG. 3 is a schematic diagram showing an example of an inspection unit.

As shown in FIG. 3, the inspection unit U3 includes a housing 30, a holding part 31, a linear driving part 32, a capturing part 33, and a light projecting/reflecting part 34. The holding part 31 holds the wafer W horizontally. The linear driving part 32 uses, for example, an electric motor as a power source, and moves the holding part 31 along a horizontal linear path. The capturing part 33 has a camera 35 such as a CCD camera or the like. The camera 35 is provided on one end side in the inspection unit U3 in the movement direction of the holding part 31 and is oriented to the other end side in the movement direction. The light projecting/reflecting part 34 projects light onto the capturing range and guides the reflected light from the capturing range toward the camera 35. For example, the light projecting/reflecting part 34 has a half mirror 36 and a light source 37. The half mirror 36 is provided at a position higher than the holding part 31 in the middle portion of the movement range of the linear driving part 32, and is configured to reflect light from below toward the camera 35. The light source 37 is provided above the half mirror 36, and is configured to irradiate illumination light downward through the half mirror 36.

The inspection unit U3 operates as follows to acquire image data of the surface of the wafer W. First, the linear driving part 32 moves the capturing part 33. Thus, the wafer W passes under the half mirror 36. In this passing process, the reflected light from each portion of the surface of the wafer W is sequentially sent to the camera 35. The camera 35 focuses an image using the reflected light from each portion of the surface of the wafer W, and acquires image data of the surface of the wafer W. When a film thickness of the film formed on the surface of the wafer W is changed, for example, the color of the surface of the wafer W is changed according to the film thickness, whereby the image data of the surface of the wafer W obtained by the camera 35 is changed. That is, the acquisition of the image data of the surface of the wafer W is equivalent to the acquisition of information about the film thickness of the film formed on the surface of the wafer W. The method of calculating the film thickness from the image data is not particularly limited.

The image data acquired by the camera 35 is sent to the control device 100. The control device 100 may estimate the film thickness of the film on the surface of the wafer W based on the image data. The estimation result is held as an inspection result in the control device 100.

[Control Device]

An example of the control device 100 will be described in detail. The control device 100 controls each element included in the coating/developing apparatus 2. The control device 100 is configured to perform a process including an act of forming each of the above-described films on the surface of the wafer W and an act of performing the developing process. The control device 100 is also configured to execute correction of parameters relating to the process based on the result of executing the process. Details of the process and the like will be described later.

Figure 4:
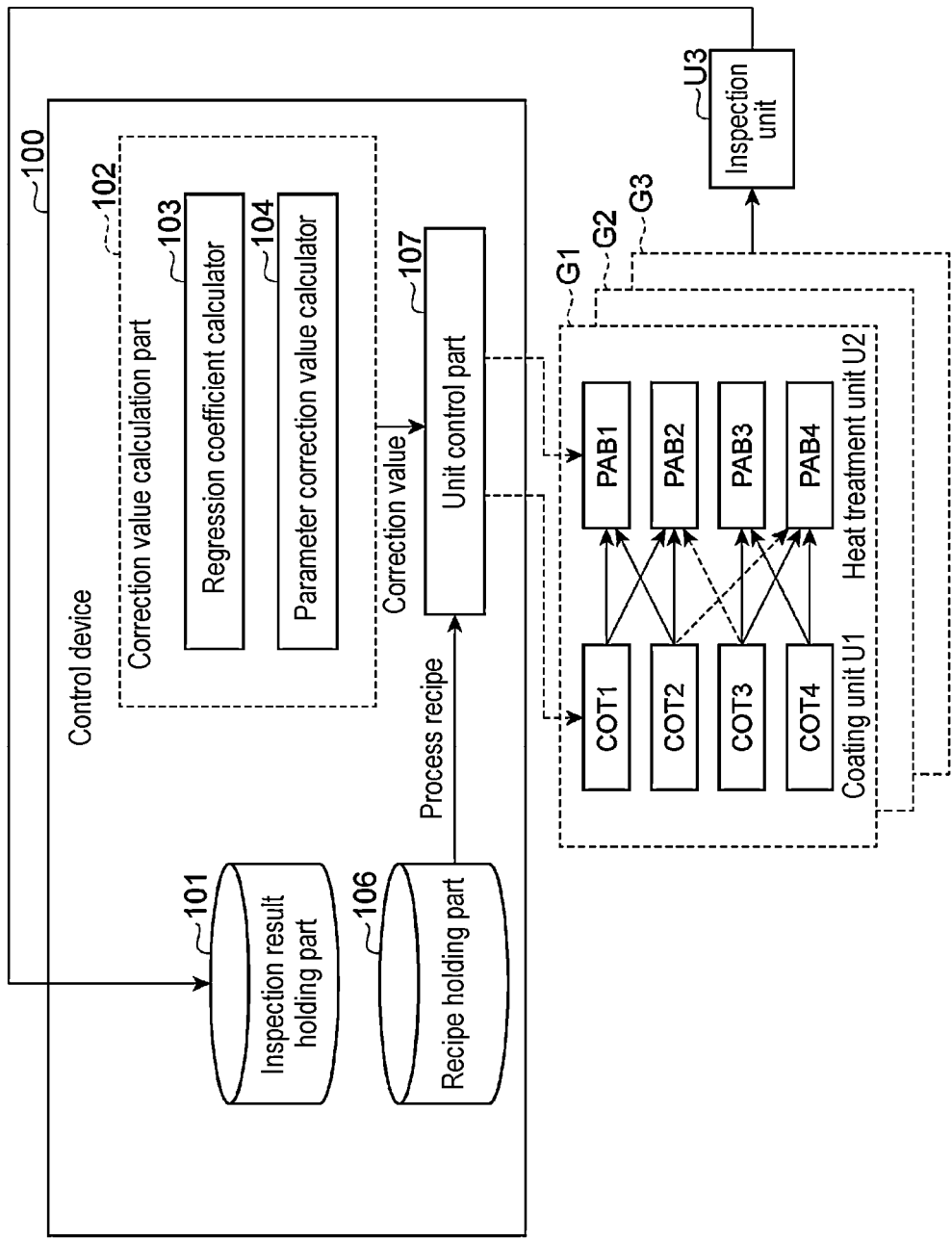
FIG. 4 is a block diagram showing an example of a functional configuration of a control device.

As shown in FIG. 4, the control device 100 includes an inspection result holding part 101, a correction value calculation part 102, a recipe holding part 106, and a unit controller 107 as functional configurations. In addition, the correction value calculation part 102 includes a regression coefficient calculator 103 and a parameter correction value calculator 104.

The control device 100 implements changing the control content in the coating unit U1 and the heat treatment unit U2 based on the inspection result obtained by the inspection unit U3. This point will be described with reference to FIG. 4. In the following embodiments, as an example, the control of the processing module 12 that forms the resist film on the wafer W will be described. In the case of the processing module 12, a process (first process) relating to the coating of the processing liquid in the coating unit U1 (first processing unit) and a process (second process) relating to the heat treatment of the processing liquid in the heat treatment unit U2 (second processing unit) are performed on the wafer W.

The inspection result holding part 101 has a function of acquiring the inspection result obtained by the inspection unit U3, i.e., the inspection result relating to the resist film on the surface of the wafer W from the inspection unit U3, and holding the inspection result. Further, in the inspection result holding part 101, information that identifies in which unit (coating unit U1 and heat treatment unit U2) the wafer W corresponding to the inspection result has been processed is acquired based on the process recipe held in the recipe holding part 106 described later. The inspection result holding part 101 acquires a data set relating to one substrate by correlating these pieces of information with the inspection results and holds the acquired data set. A series of information (data set) for each substrate held in the inspection result holding part 101 is used by the correction value calculation part 102 to calculate a correction value.

The correction value calculation part 102 has a function of calculating a correction value based on the data set including the inspection results held in the inspection result holding part 101. The calculation of the correction value by the correction value calculation part 102 is performed by the regression coefficient calculator 103 and the parameter correction value calculator 104. The regression coefficient calculator 103 calculates an expected value of a group average film thickness (characteristic amount) obtained by regression calculation, an expected value of a film thickness deviation between the coating units U1, and an expected value of a film thickness deviation between the heat treatment units U2. Further, the parameter correction value calculator 104 calculates a correction value of the parameter for each unit based on the values calculated by the regression coefficient calculator 103. Details of the calculation in each part will be described later. The correction value calculation part 102 individually calculates correction values for each of the plurality of coating units U1 and the plurality of heat treatment units U2 included in the processing module 12 as a target.

The recipe holding part 106 has a function of holding the process recipe relating to the processing module 12. The process recipe specifies the unit (coating unit U1 and heat treatment unit U2) in which the process is to be performed for each wafer W, and designates various parameters used when the process is performed in each unit.

The unit controller 107 has a function of controlling each unit so that each unit executes the process in a state in which the correction value calculated by the correction value calculation part 102 is applied to the process recipe held in the recipe holding part 106.

Next, the calculation of the correction value and the control performed using the correction value, which are executed by the control device 100, will be described with reference to FIG. 4. As described above, the processing module 12 includes the plurality of coating units U1 and the plurality of heat treatment units U2. In FIG. 4, the coating units U1 are indicated as COT1, COT2, COT3 and so forth. Furthermore, the heat treatment units U2 are indicated as PAB1, PAB2, PAB3 and so forth. In the processing module 12, the wafer W is delivered in the order of the coating unit U1, the heat treatment unit U2, and the inspection unit U3, and a predetermined process is performed in each unit to form a resist film on the surface of the wafer W. The plurality of coating units U1 (COT1, COT2 . . . ) and the plurality of heat treatment units U2 (PAB1, PAB2 . . . ) through which the wafer W passes are determined by the process recipe held in the recipe holding part 106 of the control device 100. In addition, what kind of process is to be performed in each unit is also determined by the process recipe.

The plurality of coating units U1 and the plurality of heat treatment units U2 included in the processing module 12 may be handled as a group that incorporates the units capable of constituting a path of one wafer W. Due to the structure of the processing module 12 or the function of the apparatus, there is no possibility that the wafer W loaded into a specific coating unit U1 (e.g., COT1) is loaded into all the heat treatment units U2. That is, the process recipe is created on the assumption that the wafer W loaded into the specific coating unit U1 (e.g., COT1) is loaded into some specific heat treatment units U2. In other words, the combination of the coating unit U1 and the heat treatment unit U2 through which one wafer W may pass is not randomly selected from all the units but is selected from a specific group. Also, the path of the wafer W in the process recipe is set in this manner. As described above, the plurality of coating units U1 and the plurality of heat treatment units U2 included in the processing module 12 may be handled by being divided into a plurality of groups, each of which incorporates the units that perform a process on the same wafer W. FIG. 4 shows a state in which COT1 to COT4 and PAB1 to PAB4 constitute one group G1. In such a state, the same unit group such as COT1 to COT4 or PAB1 to PAB4 included in one group G1 is referred to as a "factor." Moreover, each unit of COT1 and COT2 is called a "level." That is, a first factor (COT group) includes a plurality of first levels (coating units U1), and a second factor (PAB group) includes a plurality of second levels (heat treatment units U2). Further, FIG. 4 shows a state in which there are two groups G2 and G3 constituted by units different from the units included in the group G1. In the processing module 12, a resist film is formed on one wafer W by the coating unit U1 and the heat treatment unit U2 included in any of the groups G1 to G3, and the wafer W is inspected by the inspection unit U3.

By the way, when the processing module 12 includes a plurality of coating units U1 and a plurality of heat treatment units U2, even if each unit performs a substrate processing under the same process condition so that the resist film becomes uniform, variations may occur in the film formed depending on the characteristics of the unit.

In the case of forming the resist film on the surface of the wafer W, for example, in the coating unit U1, the thickness of the film formed on the surface of the wafer W is changed depending on the rotation speed of the wafer W when coating the processing liquid. However, when a plurality of coating units U1 is operated by designating the same parameter (rotational speed), there is a possibility that the coated film thickness may vary under the influence of the unit temperature and the like. In the heat treatment unit U2, the film thickness of the film formed on the surface of the wafer W is changed depending on the heating temperature of the wafer W during the heat treatment. However, when a plurality of heat treatment units U2 is operated by designating the same parameter (heating temperature), there is a possibility that the temperature of the wafer W is changed slightly between the units. If the temperature of the wafer W varies between the units, there is a possibility that the film thickness of the resist film solidified and formed on the wafer W varies. As described above, even when the process recipe for forming a resist film having a predetermined film thickness is the same, if the characteristics of each unit have variations, there is a possibility that the variations in the thickness of the resist film are caused by the variations in the characteristics of each unit. That is, depending on which unit the wafer W is processed through, the film thickness of the resist film may differ between the wafers W.

However, when the film thickness is not a desired value and a certain difference in the film thickness is generated under the influence of the characteristics of a certain unit in the process based on the process recipe, a correction value for correcting a difference (from the desired value) caused by the respective unit is calculated for the unit. Then, by controlling the unit through the use of the parameter that takes the correction value into account, it is presumably possible to reduce the change in the film thickness due to the characteristics of the unit. The unit controller 107 corrects the parameter of the unit specified by the process recipe held in the recipe holding part 106 based on the correction value, and then controls each unit using the corrected parameter. With such a configuration, it becomes possible to control the unit while reflecting the correction value.

However, the plurality of wafers W does not pass through the same unit as described above, but is processed by any one of the coating units U1 and any one of the heat treatment units U2 included in one group (one of G1 to G3). Of course, there are wafers W that pass through the same path. However, the units in which a process is performed are different for each wafer W. Therefore, when an inspection result is obtained which indicates that the film thickness of a certain wafer W is different from the film thickness assumed in the process recipe, it is considered that the coating unit U1 or the heat treatment unit U2 (at least one of them) which has processed the respective wafer W needs to be subjected to correction.

However, there may be a case where it is difficult to concretely specify the unit and the correction amount that can bring the film thickness closer to a target value. It is considered possible to estimate the characteristics of each unit based on comparison with the film thickness of the wafer W processed in another unit. However, it is also necessary to consider that the film thickness of the wafer W processed in another unit includes the influence of the characteristics of the respective unit. In a module such as the processing module 12 or the like that executes a plurality of processes, there may be a case where it is possible to specify which of the plurality of processes has affected the characteristics of the finished product (e.g., the film thickness of the resist film).

When a plurality of coating units U1 and a plurality of heat treatment units U2 are included in the same group such as the group G1 of the processing module 12, if there is a predetermined inspection result, it is possible to specify the unit that has affected the film thickness and the degree of influence on the film thickness. That is, the deviation for each unit (unit deviation) can be specified according to the predetermined inspection result. The term "unit deviation" used herein means a deviation from an expected value of a film thickness change amount after performing the process by each unit. The film thickness change amount in the coating unit U1 is a change in the coating amount of the processing liquid, and the film thickness change amount in the heat treatment unit U2 is a change in the film thickness before and after the heat treatment. The unit deviation may also be called a level deviation. The unit deviation relating to the coating unit U1 may be referred to as a first level deviation, and the unit deviation relating to the heat treatment unit U2 may be referred to as a second level deviation.

Specifically, for example, if there is an inspection result of the film thickness corresponding to a combination of all the units in the group through which the wafer W can pass, it is possible to specify the unit that has affected the film thickness and the degree of influence on the film thickness by using the least square method or the like. That is, in the case of COT1 to COT4 and PAB1 to PAB4, if all 16 combinations of inspection results are available, it is possible to specify the unit deviation relating to each unit. Furthermore, as another example, even when there is not a combination of all the units, if the combination of the units through which the wafer W passes is not divided into a plurality of sets, it is possible to use a series of inspection results (predetermined inspection results) included in this one set. The term "set" is the combinations associated with each other and may also be referred to as a subgroup. However, it is impossible to evaluate the unit through which the wafer W has not passed (the unit for which an inspection result does not exist).

However, even if the units are in the same group, there may be a case where a specific combination of the coating unit and the heat treatment unit is not executed in terms of the process flow of the wafer W in the apparatus. In such a case, even if the units are in the same group, the combination of the units through which the wafer W passes is divided into a plurality of sets (subgroups), which makes it difficult to specify the unit deviation. In this case, it is required to calculate the correction value for each unit after adding certain estimation.

Further, when the units are controlled by giving some correction values to the rotation speed of the coating unit U1 or the heating temperature of the heat treatment unit U2 in order to keep the film thickness of the wafer W at a predetermined value, there may be a case where a difference in controllability exists between the coating unit U1 and the heat treatment unit U2. For example, the control of changing the rotation speed in the coating unit U1 can be relatively easily performed, but the control of changing the heating temperature in the heat treatment unit U2 may be more difficult than the control of changing the rotation speed. Accordingly, in a case where calculating the correction value for each unit cannot be done accurately but requires adding some kind of estimation, it may be required to perform the estimation so that the correction amount for the heating temperature becomes small. When performing a two-step process (coating and heat treatment) using two different parameters in this way so that the film thickness of the wafer W becomes a predetermined value, there may be a case where the priority for correction is determined.

Accordingly, the control device 100 sets a concept of a group target value (a film thickness that becomes a group target) when performing a correction relating to the coating unit U1 and the heat treatment unit U2 in the processing module 12. Then, the control device 100 calculates a correction value for reducing the unit deviation in each unit while bringing the average value of the film thickness in each group close to the group target value. The group target value may be a film thickness that becomes a target value designated by the user, or may be an average of all units included in any of a plurality of groups included in the apparatus. Assuming that the group target value is an average value of the film thicknesses of the respective groups, the correction value may be calculated so that only the unit deviation is reduced, without performing the correction relating to the average value of the film thicknesses of the groups. Of the above corrections, the correction for reducing the unit deviation may be referred to as in-layer average correction. Further, when the group target value is different from a current average value of the film thicknesses, a target correction is performed so that the expected value of the average film thickness becomes the group target value.

Subsequently, the correction values for each coating unit U1 and each heat treatment unit U2 in the processing module 12 are calculated based on these correction values. The regression coefficient calculator 103 and the parameter correction value calculator 104 calculate the correction value at each of these stages. The details of the calculation of the correction value at each stage will be described later.

Figure 5:
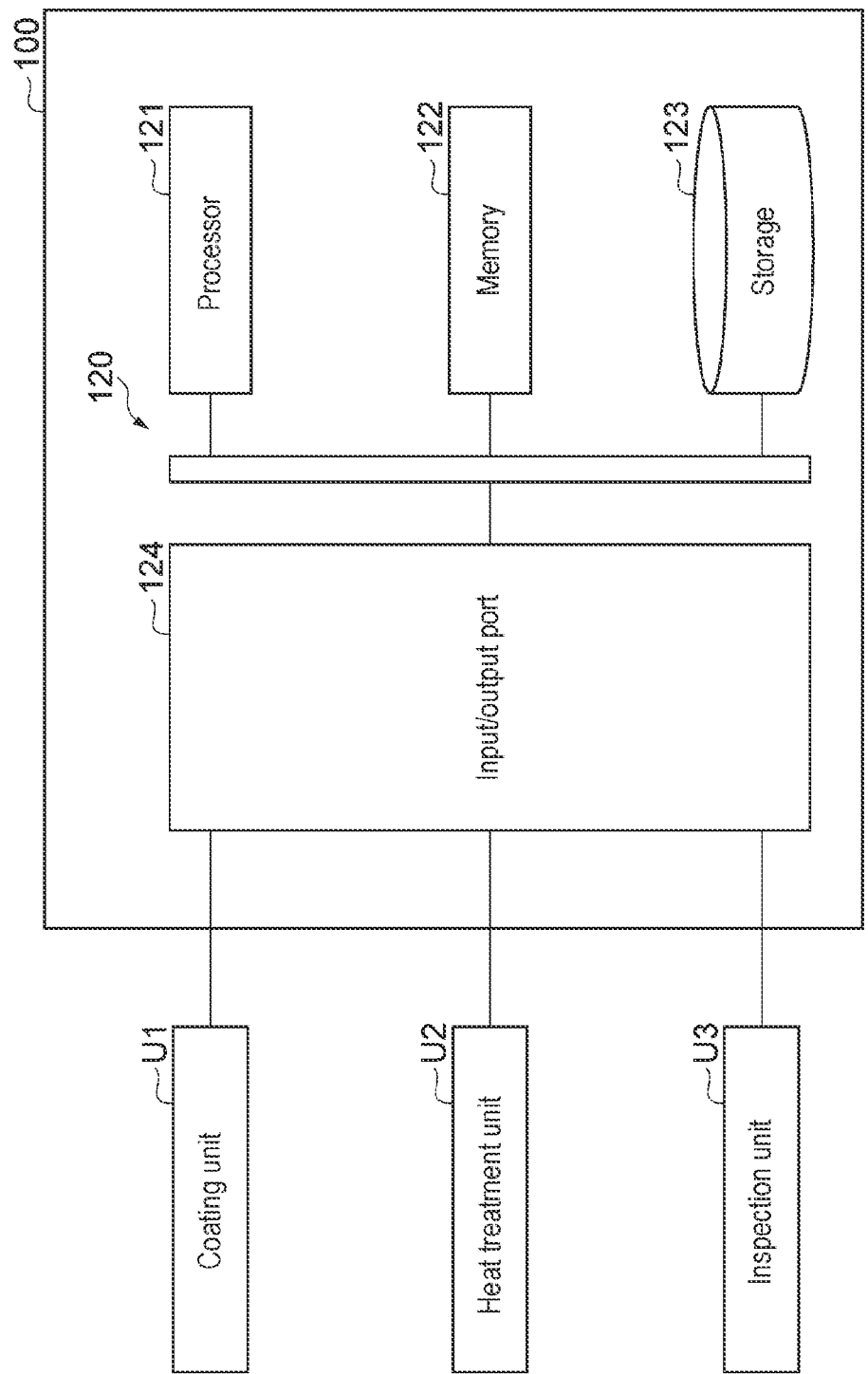
FIG. 5 is a block diagram showing an example of a hardware configuration of the control device.

The control device 100 is composed of one or more control computers. For example, the control device 100 includes a circuit 120 shown in FIG. 5. The circuit 120 includes one or more processors 121, a memory 122, a storage 123, and an input/output port 124. The storage 123 includes a non-transitory computer-readable storage medium such as a hard disk or the like. The storage medium stores a program for causing the control device 100 to execute a process procedure described later. The storage medium may be a removable medium such as a non-volatile semiconductor memory, a magnetic disk, or an optical disk. The memory 122 temporarily stores the program loaded from the storage medium of the storage 123 and the calculation result obtained by the processor 121. The processor 121 constitutes each functional module described above by executing the above program in cooperation with the memory 122. The input/output port 124 inputs and outputs an electric signal to and from a control target member according to a command from the processor 121.

The hardware configuration of the control device 100 is not necessarily limited to the one in which each functional module is constituted by the program. For example, each functional module of the control device 100 may be constituted by a dedicated logic circuit or an ASIC (Application Specific Integrated Circuit) in which the dedicated logic circuit is integrated.

[Process Procedure]

Next, a process procedure executed in the coating/developing apparatus 2 will be described as an example of a coating/developing process.

In the process procedure, first, the control device 100 controls the transfer device A1 so as to transfer a target wafer W in the carrier C to the shelf unit U10, and controls the transfer device A7 so as to arrange the wafer W in the cell for the processing module 11.

Next, the control device 100 controls the transfer device A3 so as to transfer the wafer W of the shelf unit U10 to the coating unit U1 and the heat treatment unit U2 in the processing module 11. Further, the control device 100 controls the coating unit U1 and the heat treatment unit U2 so as to form a lower layer film on the surface of the wafer W. After forming the lower layer film, the control device 100 may control the transfer device A3 so as to transfer the wafer W to the inspection unit U3, and may control the inspection unit U3 so as to inspect the surface state of the wafer W (e.g., the film thickness of the lower layer film). Thereafter, the control device 100 controls the transfer device A3 so as to return the wafer W on which the lower layer film has been formed to the shelf unit U10, and controls the transfer device A7 so as to arrange the wafer W in the cell for the processing module 12.

Next, the control device 100 controls the transfer device A3 so as to transfer the wafer W of the shelf unit U10 to the coating unit U1 and the heat treatment unit U2 in the processing module 12. Further, the control device 100 controls the coating unit U1 and the heat treatment unit U2 so as to form a resist film on the lower layer film of the wafer W. For example, the control device 100 controls the coating unit U1 so as to form the resist film by coating a processing liquid for forming the resist film on the lower layer film of the wafer W. Subsequently, the control device 100 controls the heat treatment unit U2 so as to subject the resist film to a heat treatment. After forming the resist film, the control device 100 controls the transfer device A3 so as to transfer the wafer W to the inspection unit U3, and controls the inspection unit U3 so as to inspect the surface state of the wafer W (e.g., the film thickness of the resist film).

After acquiring the inspection result from the inspection unit U3, the control device 100 calculates an expected value of the average film thickness in the group and the unit deviation relating to the coating unit U1 and the heat treatment unit U2 from the inspection result. Specifically, the control device 100 calculates the unit deviations (first and second unit deviations) relating to the rotation speed (first parameter) in the coating unit U1 (first processing unit) and the heating temperature (second parameter) in the heat treatment unit U2 (second processing unit). Then, the control device 100 specifies correction values relating to the film thickness from the calculated unit deviations, and corrects and controls the rotation speed or the heating temperature in each unit.

Thereafter, the control device 100 controls the transfer device A3 so as to return the wafer W to the shelf unit U10, and controls the transfer device A7 so as to arrange the wafer W in the cell for the processing module 13.

Next, the control device 100 controls the transfer device A3 so as to transfer the wafer W of the shelf unit U10 to each unit in the processing module 13, and controls the coating unit U1 and the heat treatment unit U2 so as to form an upper layer film on the resist film of the wafer W. After forming the upper layer film, the control device 100 may control the transfer device A3 so as to transfer the wafer W to the inspection unit U3, and may control the inspection unit U3 to inspect the surface state of the wafer W (e.g., the film thickness of the upper layer film). Thereafter, the control device 100 controls the transfer device A3 so as to transfer the wafer W to the shelf unit U11.

Next, the control device 100 controls the transfer device A8 so as to send the wafer W of the shelf unit U11 to the exposure apparatus 3. Thereafter, the control device 100 controls the transfer device A8 so as to receive the exposed wafer W from the exposure apparatus 3 and arrange the wafer W in the cell of the shelf unit U11 for the processing module 14.

Subsequently, the control device 100 controls the transfer device A3 so as to transfer the wafer W of the shelf unit U11 to each unit in the processing module 14, and controls the coating unit U1 and the heat treatment unit U2 so as to perform a developing process on the resist film of the wafer W. Thereafter, the control device 100 controls the transfer device A3 so as to return the wafer W to the shelf unit U10, and controls the transfer devices A7 and A1 so as to return the wafer W into the carrier C. Thus, the process is completed.

[Substrate Processing Control Method]

Next, a substrate processing control method for the processing module 12 performed by the control device 100 will be described with reference to FIGS. 6 to 12. The substrate processing control method includes a procedure of calculating correction values relating to the rotation speed (first parameter) of the coating unit U1 (first processing unit) and the heating temperature (second parameter) of the heat treatment unit U2 (second processing unit), and a procedure of controlling each unit.

As shown in FIG. 6, first, the control device 100 executes step SOI (acquisition step). In step SOI, the inspection result (film thickness inspection result) relating to the wafer W is acquired from the inspection unit U3 and held in the inspection result holding part 101. At this time, the inspection result holding part 101 acquires, from the recipe holding part 106, information that specifies the units (the coating unit U1 and the heat treatment unit U2) that have processed the wafer W for which the inspection result has been acquired. Thus, a series of data sets is acquired by the control device 100. The information specifying the units that have processed the wafer W (the coating unit U1 and the heat treatment unit U2) may be acquired from the inspection unit U3.

Next, the control device 100 executes step S02 (calculation step). In step S02, the regression coefficient calculator 103 of the correction value calculation part 102 creates a model relating to the film thickness change based on the inspection result held in the inspection result holding part 101. Specifically, the regression coefficient calculator 103 creates a model relating to the film thickness change that corresponds to a change in parameter setting in each unit when controlling the film thickness by each process in the coating unit U1 and the heat treatment unit U2 in a specific group. Then, a function (objective function) for estimating an expected value of the average film thickness, an expected value of the unit deviation of the coating unit U1, and an expected value of the unit deviation of the heat treatment unit U2 in the specific group is set based on the model. Thereafter, the optimum solution of the expected value of the average film thickness, the unit deviation of the coating unit U1, and the unit deviation of the heat treatment unit U2 is obtained so that the unit deviations of the coating unit U1 and the heat treatment unit U2 come close to zero while the expected value of the average film thickness comes close to the group target value described above. The optimum solution of the expected value of the average film thickness, the unit deviation of the coating unit U1, and the unit deviation of the heat treatment unit U2 corresponds to the regression coefficient.

The optimum solution of the expected value of the average film thickness, the unit deviation of the coating unit U1, and the unit deviation of the heat treatment unit U2 can be obtained by solving an equality-constrained least squares problem. The equality-constrained least squares problem is based on a model that assumes the control of the film thickness in a group including a plurality of coating units U1 and a plurality of heat treatment units U2. However, depending on a condition, the solution of the equality-constrained least squares problem may not be uniquely determined due to lack of rank. Therefore, by adding a constraint condition so as to minimize the norm of the unit deviation of the coating unit U1 and the unit deviation of the heat treatment unit U2 except for the expected value of the average film thickness, the equality-constrained least squares problem is formulated as a kind of multi-objective optimization problem. Then, the regression coefficient can be calculated by solving the above multi-objective optimization problem. It can be said that the above constraint condition is set such that the priority relating to minimizing the norm of the unit deviation of the coating unit U1 and the unit deviation of the heat treatment unit U2 (norm minimization priority) is higher than the norm minimization priority of the average film thickness.

When the optimum solutions of the expected value of the average film thickness, the unit deviation of the coating unit U1, and the unit deviation of the heat treatment unit U2 are obtained by solving the above multi-objective optimization problem, the control device 100 executes step S03 (correction step). In step S03, the correction value of the parameter corresponding to the optimum solution is obtained based on these optimum solutions. The parameter correction value calculator 104 calculates a correction value of the parameter. By executing step S03, the correction value of the film thickness in each unit is fixed. Therefore, the correction value of the parameter corresponding to the correction value of the film thickness is calculated. The calculation of the correction value of the parameter in each unit can be performed based on the relationship between the film thickness held by the control device 100 in advance and the parameter of each unit. That is, the change in the film thickness when the parameter (norm) of each unit is changed is acquired in advance, and the size of the film thickness to be changed by correction is obtained from the unit deviation, whereby a correction value of the parameter can be obtained from the relationship acquired in advance.

Next, the control device 100 executes step S04 (correction step). In step S04, the unit controller 107 controls each unit (the coating unit U1 or the heat treatment unit U2) based on the process recipe held in the recipe holding part 106 and the correction value calculated by the correction value calculation part 102. A corrected parameter is calculated by applying the correction value calculated by the correction value calculation part 102 to the parameter in each unit included in the process recipe. The unit controller 107 controls each unit based on the corrected parameter. Thus, a process is performed in each unit while reflecting the correction value.

Figure 7A:
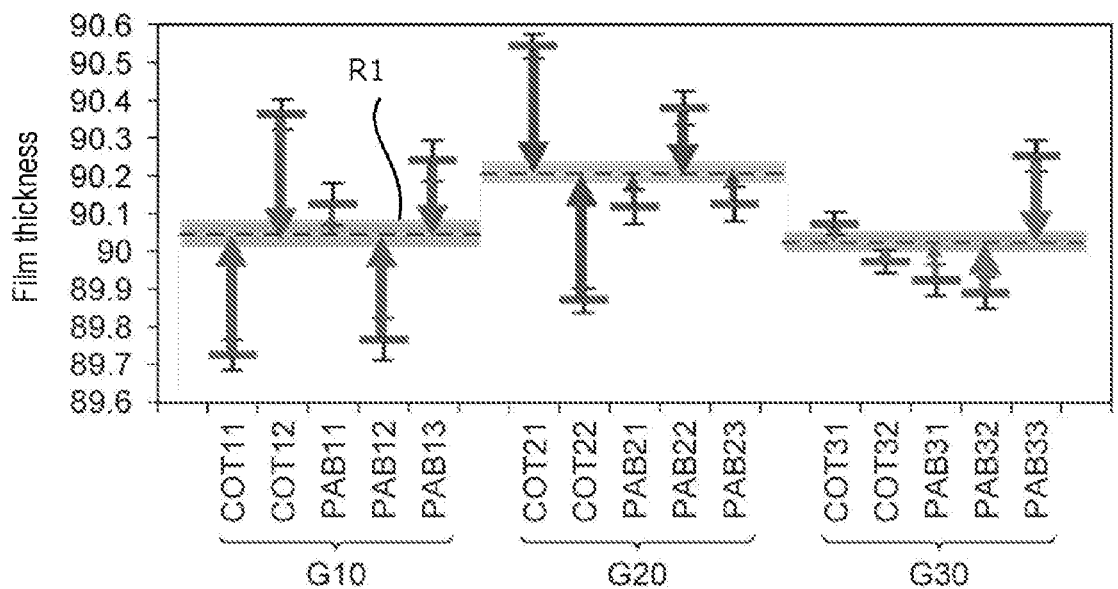
FIGS. 7A and 7B are diagrams for explaining an example of film thickness correction.
Figure 7B:
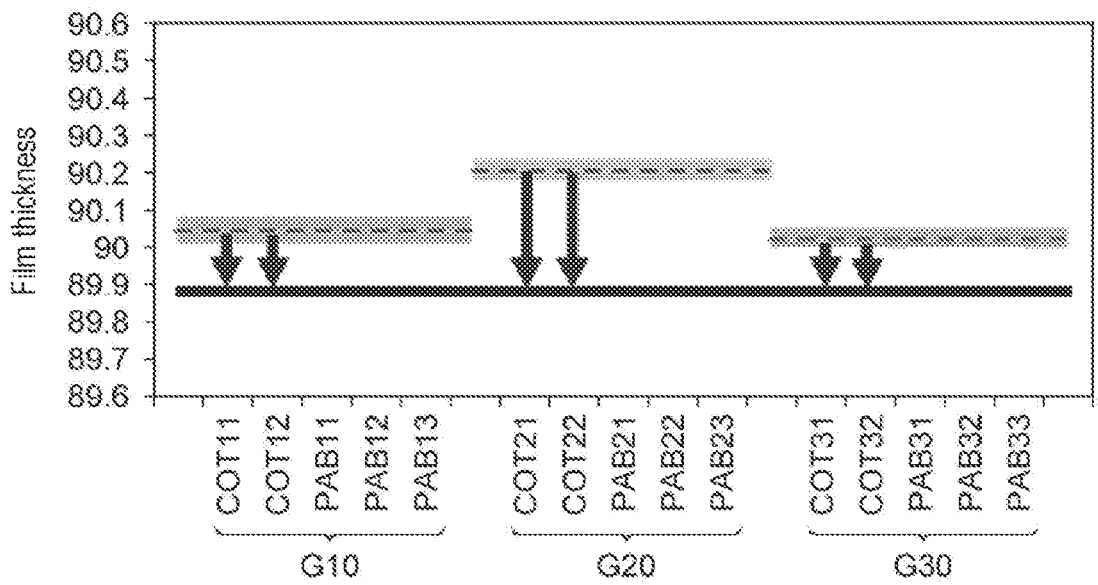

The above series of procedures will be described as a specific example with reference to FIG. 7A. In FIG. 7A, three groups G10 to G30 are shown. The group G10 is composed of COT11, COT12, and PAB11 to PAB13. The group G20 is composed of COT21, COT22, and PAB21 to PAB23. Further, the group G30 is composed of COT31, COT32, and PAB31 to PAB33. FIG. 7A shows the unit deviation of the film thickness for each unit included in each group. A value RI indicated by a broken line for each unit in the group G10 indicates an average value of the film thickness of the wafer W processed in the group G10. As shown in FIG. 7A, the average value of the film thickness of the wafer W in the group G10 is 90.05 nm.

On the other hand, the film thickness of COT11 is 89.73 nm. This indicates that as the wafer W is processed in the COT11, the COT11 affects the change in the film thickness such that the film thickness of the resist film subjected to the heat treatment is decreased by 0.32 nm from the target value of 90.05 μm (−0.32 nm). The film thickness of PAB11 is 90.13 nm. This indicates that as the wafer W is processed in the PAB11, the PAB11 affects the change in the film thickness such that the film thickness of the resist film subjected to the heat treatment is increased by 0.08 nm from the target value of 90.05 nm (+0.08 nm). As described above, it can be noted that before the correction, the process in each unit affects the change in the film thickness of the resist film subjected to the heat treatment. In the case of COT11, −0.32 nm is the unit deviation relating to the film thickness. In the case of PAB11, +0.08 nm is the unit deviation relating to the film thickness. Therefore, the wafer W that has passed through the COT11 and the PAB11 undergoes a film thickness change corresponding to the unit deviations of the two units, whereby the film thickness is changed by −0.32 nm+0.08 nm=−0.24 nm with respect to the group target value (the average value of the film thicknesses of the wafers W).

In this way, the correction value calculation part 102 sets the group target value for each group based on the result held in the inspection result holding part 101. Then, the correction value calculation part 102 calculates unit deviations (first unit deviation and second unit deviation) relating to the film thickness change in the process performed in each unit, based on the difference from the group target value. The group target value may be set to a value different from the average value of the film thicknesses of the wafers W.

If the unit deviation relating to the film thickness for each unit group can be calculated, the correction value may be set based on the unit deviation. That is, since the unit deviation with respect to the change in film thickness is −0.32 nm in the case of COT11, it is only necessary to calculate the correction value of the parameter for implementing the process so that the film thickness becomes +0.32 nm. Furthermore, since the unit deviation with respect to the change in film thickness is +0.08 nm in the case of PAB11, it is only necessary to calculate the correction value of the parameter for implementing the process so that the film thickness becomes −0.08 nm.

As for the calculation of the regression coefficient described in step 502, the detailed procedure may be changed in accordance with the inspection result held in the inspection result holding part 101 and in consideration of the safety degree or the correction ease with respect to the correction of the parameter for correction. That is, the priority for minimizing the norm (norm minimization priority) may be set, and the detailed procedure for calculating the correction value may be changed in consideration of this priority. FIG. 8 shows a procedure for calculating the correction value when the norm minimization priority is taken into consideration.

First, the regression coefficient calculator 103 executes step S11. In step S11, it is determined whether the unit deviation can be calculated by the least square method (equality-constrained least square method) using the result held in the inspection result holding part 10. Then, if the result of this determination is YES, the regression coefficient calculator 103 executes step S12. In step S12, the unit deviations (first unit deviation and second unit deviation) of each unit are calculated using the equality-constrained least square method.

As described above, if there is an inspection result of the film thickness corresponding to the combination of all the units in the same group through which the wafer W can pass, the unit deviations relating to all the units can be specified by using the equality-constrained least square method. For example, FIG. 9A shows an example of a group including four coating units U1, i.e., COT1 to COT4, and four heat treatment units U2, i.e., PAB1 to PAB4. In the group shown in FIG. 9A, if the inspection results of the film thickness of the resist film in all the combinations can be obtained, as shown in FIG. 9B, the unit deviation relating to each unit can be calculated using the equality-constrained least square method. That is, by means of the equality-constrained least square method, it is possible to calculate the overall average (the average value of the film thicknesses in the group) and the unit deviation (a value corresponding to the difference) of the film thickness of the resist film for each unit with respect to the overall average. Although the case where the inspection result of the film thickness of the resist film in all the combinations is obtained has been described above, whether or not the unit deviation can be calculated using the equality-constrained least square method may actually depend on whether the obtained result is divided into subgroups. Therefore, in step S11, it is determined whether the obtained result is divided into subgroups. Then, if the determination result in step S11 is YES, the unit deviation and the correction value are calculated in step S12 by using the equality-constrained least square method.

Meanwhile, when the determination result in step S11 is NO, i.e., when the inspection results are not sufficiently uniform so that the unit deviation cannot be calculated by the equality-constrained least square method, the regression coefficient calculator 103 executes step S13. In step S13, it is determined whether or not there is a norm minimization priority when calculating the unit deviation and the correction value for each factor (unit group) (whether or not the norm minimization priority is different for each factor). Then, when the result of this determination is YES, i.e., when there is a norm minimization priority when calculating the unit deviation and the correction value for each factor (whether or not the norm minimization priority is different for each factor), the regression coefficient calculator 103 executes step S14. In step S14, the unit deviation is calculated while minimizing the norm for the group target value in the order based on the norm minimization priority for each factor. On the other hand, when the result of this determination is NO, i.e., when there is no norm minimization priority when calculating the unit deviation and the correction value for each factor (if the norm minimization priority for each factor is the same), the regression coefficient calculator 103 executes step S15. In step S15, the unit deviation for each unit is calculated so that the norm of all factors other than the intercept is minimized.

With reference to FIG. 8, the procedure for changing the calculation method depending on whether the unit deviation can be calculated by the equality-constrained least square method and whether there is the norm minimization priority for each factor has been described above. However, the calculation (steps S12, S14 and S15) under each condition shown in FIG. 8 may be integrated into step S14. That is, the unit deviation may be calculated by executing only step S14 without performing steps S11 and S13. For example, if the solution can be obtained by using the equality-constrained least square method as in step S12, it means that the solution has no degree of freedom. In this case, the same solution is calculated regardless of whether or not there is a norm minimization priority. Therefore, the solution can also be obtained by appropriately setting the norm minimization priority and executing the algorithm corresponding to step S14. Furthermore, if it is considered that the norm minimization priority in step S14 is the same for each factor in step S15, the solution is obtained by the same algorithm as in step S14. Therefore, even if only step S14 is executed, it is possible to obtain the same solution as that available when the calculation is performed based on the flow of FIG. 8.

Steps S13 to S15 will be described with reference to FIGS. 10A and 10B and FIGS. 11 and 12. FIG. 10A shows an inspection result in a group including five coating units U1, i.e., COT1 to COT5, and five heat treatment units U2, i.e., PAB1 to PAB5. In the example shown in FIG. 10A, the inspection result of the film thickness of the resist film is not obtained for all the combinations. That is, FIG. 10A shows a state in which Set 1 as an inspection result relating to the combination of COT1, COT2, COT3, PAB1, and PAB2 and Set 2 as an inspection result relating to the combination of COT4, COT5, PAB3, PAB4, and PAB5 is obtained. In this state, as shown in FIG. 10B, it is possible to calculate an overall average (corresponding to the group target value), differences between the overall average and average values of Set 1 and Set 2, and a unit deviation of each unit from the group target value based on the least square method in Set 1 and Set 2, respectively. However, the unit deviation of each unit is the Set unit for which the inspection result is obtained. Therefore, the correction value based on this unit deviation is a correction value for making correction toward the average value in the Set unit, and is not a correction value corresponding to correction made on a group-by-group basis. In addition, if the unit deviation of each unit with respect to the overall average in the group is calculated by the least square method with the obtained inspection result shown in FIG. 10A, the equation is insufficient for the unknown number. Therefore, there are infinite solutions. That is, the unit deviation of the process in each unit cannot be calculated.

In the case where there is an infinite number of solutions in the equality-constrained least square method, it is general to select the solution that minimizes the norm of explanatory variables. In this example, the overall average (intercept) and each unit deviation correspond to the explanatory variables. FIG. 11 shows a result of calculating the unit deviation of each unit from the inspection result shown in FIG. 10A so that the norm of each unit deviation excluding the expected value (intercept) of the average film thickness in the group is minimized. In this case, as shown in FIG. 11, the norm of COT/PAB is 1.572, and the unit deviations for COT1 to COT5 and PAB1 to PAB5 are 1.278 and 0.915, respectively. It can be said that the process (calculation) of specifying the solution under the norm minimization condition corresponds to step S15 shown in FIG. 8. Further, a known method may be used as a specific procedure of the process of specifying the solution under the norm minimization condition.

In the result shown in FIG. 11, the norm other than the intercept in the entirety of the plurality of units is minimized. However, the priority of correction regarding the parameter according to the unit is not taken into account. As described above, when there is a circumstance in which it is desired to reduce the correction value for the heating temperature of the heat treatment unit U2, a norm minimization process is performed so that the correction value of the heating temperature for the part relating to the parameter for which the correction value is desired to be reduced, i.e., the heat treatment unit U2, is reduced. In the case of the present embodiment, a process of calculating the unit deviation is performed so that the norm of the heating temperature of the heat treatment unit U2 is minimized.

As described above, when the norm minimization priorities relating to the unit deviation calculation (correction value calculation) are different for the parameters of individual units, the unit deviation of each unit for minimizing the norm is calculated from the parameter having a high norm minimization priority. In the case of the present embodiment, the parameters of each unit are two types of parameters. i.e., the rotation speed of the coating unit U1 and the heating temperature of the heat treatment unit U2. The parameter having a high norm minimization priority corresponds to a parameter whose correction value is not desired to be increased more than necessary. Examples of the parameter (factor) whose correction value is not desired to be increased more than necessary include a parameter that is not easily corrected, and a parameter that may cause a certain risk when subjected to correction. On the other hand, examples of the parameter whose correction value may be large include a parameter that can be easily corrected, and a parameter that has a small risk when subjected to correction. When a parameter whose correction value is desired to be kept as small as possible is present as described above, a factor (unit group) to which the parameter belongs is treated as having a high norm minimization priority. Then, when minimizing the norm, the minimization calculation is performed from a factor having a higher norm minimization priority. In the case of the configuration of the present embodiment, the PAB having the heating temperature as a parameter is a factor having a higher norm minimization priority than the COT having the rotation speed as a parameter. Therefore, the unit deviation of the process for each unit for minimizing the norm is calculated from the factor having a higher norm minimization priority, i.e., the PAB.

The unit deviation calculation (the calculation corresponding to step S14 in FIG. 8) in consideration of the norm minimization priority can be performed by, for example, the following method. That is, the equality constraint and the objective function in which the expected value of the average film thickness in a certain group and the unit deviation of the film thickness in each unit are used as explanatory variables (regression coefficient) will be described. Then, an additional objective function considering the norm minimization priority is added, and the regression coefficient is calculated by solving the multi-objective optimization problem. Thus, the unit deviation can be calculated so as to minimize the norm in consideration of the norm minimization priority for each unit. A known method may be used to calculate the regression coefficient itself.

FIG. 12 shows the result of calculating the unit deviation of each unit by the above-described procedure. In the result shown in FIG. 12, as compared with the result shown in FIG. 11, the square error remains the same. However, the unit deviations of COT1 to COT5 are large and the unit deviations of PAB1 to PAB5 are small. Specifically, in the result shown in FIG. 12, the norm of the coating unit U1 (COT1 to COT5) is 1.681, and the norm of the heat treatment unit U2 (PAB1 to PAB5) is 0.663.

In the case of a configuration in which the unit deviation of the process for each unit is calculated so that the norm is minimized sequentially from the factor with the highest norm minimization priority, the norm for the entire unit is not the minimum. For example, in the calculation result shown in FIG. 11, the COT/PAB norm is 1.572. In the calculation result shown in FIG. 12, the COT/PAB norm is 1.807. However, for the process of a unit relating to a factor having a high norm minimization priority, the unit deviation can be calculated to be small. In other words, the norm can be reduced with respect to the unit deviation of the process relating to the parameter having a higher norm minimization priority. This is because the calculation is performed so that the unit deviation relating to the factor having a higher norm minimization priority becomes smaller.

Whether or not the norm minimization priority is set can be determined by the correction value calculation part 102 of the control device 100. Then, when step S13 is executed, the determination can be performed based on the information held by the apparatus itself.

In the present embodiment, a case where the unit deviations (first unit deviation and second unit deviation) are calculated to perform calculation for the process based on two parameters in two processing units will be described. The two processing units are the coating unit U1 and the heat treatment unit U2, and the two parameters are the rotation speed and the heating temperature. However, the above procedure can be performed by the same procedure even when the number of processing units is three or more and the number of types of parameters is increased to three or more. That is, when the norm minimization priorities of three stages are set to the three types of processing units (i.e., three types of processes), the process of calculating the unit deviation for minimizing the norm is repeated sequentially from the processing unit having the highest norm minimization priority as described above. Thus, the three types of unit deviations in the three types of units that perform the three processes can be calculated in a state in which the priority is taken into consideration. Furthermore, even when the number of types of processing units and parameters is four or more, the unit deviation can be calculated by the same procedure in consideration of the priority. The norm minimization priority may be set only in some processing units (some processes).

The substrate processing control method described above may be configured to be performed at a predetermined timing when performing the substrate processing using the substrate processing system 1. For example, the substrate processing may be performed at a timing designated by the user. In addition, when the processing of the substrates of an arbitrary lot is completed, the film thickness of the predetermined number of substrates closest to the lot may be referred to, and the process may be performed when the simple average of the film thicknesses of the substrates processed in each unit deviates from a predetermined range. In this case, a correction amount in each unit may be calculated from the aforementioned simple average.

Furthermore, the start of the above process may be determined based on the result of comparison between the 95% confidence interval and the reference value. Specifically, when the process is completed for the substrates of an arbitrary lot, the 95% confidence interval of the estimated value in the case of estimating the unit deviation of each unit is calculated from the measurement result of the film thicknesses of the predetermined number of substrates closest to the lot. Then, when the 95% confidence interval does not include a value serving as a reference of the estimated value, it may be determined that the above process is performed. For example, when the group target value is the same as the current expected value of the average film thickness, the case where the 95% confidence interval of the unit deviation in the coating unit U1 or the heat treatment unit U2 does not include the reference value 0 may be used as a trigger for starting the substrate processing control method. In addition, when the group target value is set separately from the expected value of the average film thickness, it may be assumed that, for example, only the first unit is involved in the correction of the average film thickness. Then, based on this assumption, the case where the 95% confidence interval of the sum of the expected value of the average film thickness and the deviation of the first unit does not include the group target value as the reference value may be used as a trigger. In this case, the case where the 95% confidence interval of the deviation of the second unit does not include the reference value 0 may be used as a trigger. The above-described method is an example, and the present disclosure is not limited thereto.

[Operation]

According to the substrate processing control method and the substrate processing apparatus according to the above-described embodiments, the data set including information specifying the first level (coating unit U1) at which the first process has been performed, information specifying the second level (heat treatment unit U2) at which the second process has been performed, and information about a characteristic amount (e.g., a film thickness) relating to characteristics of the substrate is acquired by the plurality of processed substrates. Furthermore, in the calculation step, the information including the expected value of the characteristic amount, the level deviation of the first level with respect to the expected value, and the level deviation of the second level with respect to the expected value is calculated. Moreover, the first parameter in the first unit or the second parameter in the second unit is corrected based on the calculated information. With such a configuration, the level deviation can be calculated for each of the plurality of first processing levels and the plurality of second processing levels, and the respective parameters can be corrected based on the level deviation. Accordingly, even if the substrates have been processed at a plurality of levels such as plural types of processing units, it is possible to appropriately correct the target value for each unit through the use of the data set including the characteristic amount of the substrate.

Conventionally, a method of correcting a characteristic amount relating to the characteristics of a processed substrate has been studied when the characteristic amount is different from a target value. However, there has not been studied a method of appropriately determining a desirable correction amount of a parameter relating to a processing unit that has performed a certain process and then correcting the parameter, based on the characteristic amount of the substrate repeatedly subjected to plural kinds of processing. In particular, when there is a plurality of processing units for performing a plural kinds of processing, there has not been studied a method of considering the degree of change in characteristic amount of a substrate changed by a certain processing unit and then calculating a correction value for correcting the characteristic amount. On the other hand, according to the substrate processing control method and the substrate processing apparatus described above, the level deviation is calculated for each of the first level and the second level, and the parameter of each unit is corrected based on the calculation result. Therefore, even if the substrate has been processed at a plurality of levels such as plural types of processing units, it is possible to appropriately correct the target value for each unit through the use of the data set including the characteristic amount of the substrate.

In addition, in the above-described embodiments, when calculating the first level deviation at the first level and the second level deviation at the second level, the level deviations are calculated so that the norm other than the expected value of the characteristic amount is minimized. With the above configuration, the first level deviation (first unit deviation) and the second level deviation (second unit deviation) can be calculated even when only a data set is acquired in a range in which the unit deviation for each unit cannot be calculated by the conventional method such as the least square method. Therefore, according to the above configuration, it is possible to appropriately correct the target value for each unit. In particular, even when the data set is insufficient, the unit deviation for each unit can be appropriately calculated from the viewpoint of minimizing the norm. Therefore, it becomes possible to perform more appropriate correction.

Further, in the above-described embodiments, when the norm minimization priority corresponding to the order of prioritizing reduction of correction values is predetermined, the unit deviation is calculated sequentially from the factor having a higher norm minimization priority so that the norm other than the expected value of the characteristic amount becomes smallest. With such a configuration, it is possible to prevent the factor having a higher norm minimization priority from being corrected by including a unit deviation derived from another factor. Therefore, it becomes possible to reduce the correction value for the factor having a higher norm minimization priority. In the above-described embodiments, the heating temperature of the heat treatment unit U2 corresponding to the second parameter is a parameter belonging to the factor having a higher norm minimization priority. Therefore, the correction value of the heating temperature can be reduced by adopting the configuration in which the correction value is calculated by minimizing the norm of the unit deviation from the heat treatment unit U2.

Furthermore, as in the above-described embodiments, it is possible to divide the plurality of first processing units and the plurality of second processing units into groups, each of which includes processing units that may possibly perform processing on one substrate. In such a case, a first unit deviation and a second unit deviation are calculated by setting a group target value for each group including the processing units that may possibly perform processing on one substrate. Thus, the unit deviation can be calculated more accurately as compared with a configuration in which the unit deviation is calculated in consideration of the combination of the processing units that may not possibly perform processing on one substrate. When the unit deviation is calculated without considering the group, for example, the unit deviation may possibly be calculated in consideration of the substrate processing using the first processing unit and the second processing unit included in different groups. In such a case, there is a possibility that the calculation accuracy of the unit deviation decreases. On the other hand, by adopting the configuration in which the unit deviation is calculated for each group as described above, it is possible to accurately calculate the unit deviation.

OTHER EMBODIMENTS

Although various exemplary embodiments have been described above, various omissions, substitutions and changes may be made without being limited to the exemplary embodiments described above. In addition, elements in different embodiments may be combined to form other embodiments.

For example, in the above-described embodiments, there has been described a case where the parameter of each of the plurality of coating units U1 and the plurality of heat treatment unit U2 is corrected in forming a resist film in the processing module 12. However, the substrate processing control method described above may also be applied to a process different from forming the resist film on the substrate. For example, the lower layer film and the upper layer film are formed in the coating/developing apparatus 2 described above. The control device 100 may also control these processes while correcting the parameter. Furthermore, the parameter correction by the control device 100 may be applied to a substrate processing not described in the above-described embodiment. As can be noted from the foregoing, the target of the calculation of the unit deviation relating to the process and the correction of the parameter based on the unit deviation described in the above embodiment is not particularly limited.

Further, the characteristic amount is not limited to the film thickness of the film formed on the substrate. For example, a line width of a resist pattern may be used as the characteristic amount. Moreover, the parameter relating to the first process and the parameter relating to the second process may also be appropriately changed according to the characteristic amount. For example, in the above-described embodiments, the rotation speed of the coating unit U1 for coating the processing liquid is used as a parameter. However, the rotation speed may be selected as a parameter for other processing units that perform processing while rotating the substrate. Furthermore, when performing some kind of processes using the processing liquid, the characteristics of the processing liquid may be selected as a parameter. In addition, one of the processing conditions in the processing unit may be selected as a parameter. As described above, the characteristic amount relating to the characteristics of the substrate may be appropriately selected, and the first process and the second process may be appropriately selected according to the characteristic amount. In addition, the first parameter in the first process and the second parameter in the second process may also be appropriately changed based on the characteristic amount and the like.

Furthermore, in the above-described embodiments, there has been described a configuration in which as shown in FIG. 6, the regression coefficient is calculated and then the correction value of the parameter for each unit is calculated. However, this procedure may be changed.

In addition, it may be possible to adopt a configuration in which when the control device 100 calculates the correction value, all steps shown in FIG. 8 are not performed. For example, when it is possible to acquire only the data set for which the unit deviation cannot be calculated by the least square method and when it is determined that there is priority for each factor, step S11 and step S13 may be omitted. As described above, when the number or contents of data sets acquired by the control device 100, the characteristics of the parameter of the processing unit for which the unit deviation and the correction value are calculated, and the like are known in advance, the processing may be appropriately omitted based on the contents grasped by the control device 100.

In the above-described embodiments, there has been described a case where the expected value of the average film thickness, the first unit deviation, and the second unit deviation are handled separately when calculating the correction value for reducing the unit deviation while taking the norm minimization priority into consideration. However, it may be possible to adopt a configuration in which some of these three elements are handled collectively. Specifically, it is conceivable to integrally handle the expected value of the average film thickness and the first unit deviation (the unit deviation of the coating unit U1) described in the above embodiments. In this case, a combination of the first unit deviation and the expected value (intercept) of the average film thickness may be handled as the expected value of the film thickness of the first unit, the objective function may be described by the expected value of the film thickness relating to the first unit and the second unit deviation, and an optimum solution of these regression coefficients may be calculated. The expected value of the film thickness relating to the first unit is not zero. However, the same effect as the norm minimization of the first unit deviation can be obtained by replacing the norm minimization with variance minimization.

According to the present disclosure in some embodiments, it is possible to provide a technique capable of properly controlling various parameters according to a substrate processing state.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An information processing method, comprising:
   an acquisition step of acquiring a data set for each of a plurality of substrates subjected to a first process at a first level of a first factor and then subjected to a second process at a second level of a second factor, wherein the first factor includes a plurality of first levels for performing the first process on a substrate based on a first parameter, which is a process condition of the first process, wherein the second factor includes a plurality of second levels for performing the second process on the substrate based on a second parameter, which is a process condition of the second process, and wherein the data set includes information specifying the first level at which the first process has been performed, information specifying the second level at which the second process has been performed, and information about a substrate characteristic amount, which is a process result of the first process and the second process; and
   a calculation step of calculating information including an expected value of the substrate characteristic amount, a level deviation of the first level with respect to the expected value of the substrate characteristic amount, and a level deviation of the second level with respect to the expected value of the substrate characteristic amount based on the data set corresponding to each of the plurality of substrates,
   wherein the level deviation of the first level corresponds to a deviation from the expected value of the substrate characteristic amount after the first process is performed on the substrate by the first level, and
   wherein the level deviation of the second level corresponds to a deviation from the expected value of the substrate characteristic amount of the substrate after the second process is performed on the substrate by the second level.

2. The information processing method of claim 1, wherein in the calculation step, the information including the level deviation of the first level with respect to the expected value of the substrate characteristic amount and the level deviation of the second level with respect to the expected value of the substrate characteristic amount is calculated, based on the data set corresponding to each of the plurality of substrates, by a least square method with a constraint condition in that a norm of the level deviations of the first level and the second level is minimized.

3. The information processing method of claim 1, wherein in the calculation step, when an order of priority in reducing correction values of the first factor and the second factor is predetermined for the first factor and the second factor, the level deviations are calculated, based on the data set, sequentially from one of the first factor and the second factor, which has a higher priority than the other one of the first factor and the second factor, by a least square method with a constraint condition in that a norm of the level deviation of the first level and a norm of the level deviation of the second level are minimized sequentially in the predetermined order of priority.

4. The information processing method of claim 1, wherein the first factor, which includes the first level, includes a plurality of first processing units included in a first substrate processing apparatus, and
   wherein the second factor, which includes the second level, includes a plurality of second processing units included in a second substrate processing apparatus.

5. The information processing method of claim 4, wherein the plurality of first processing units is a film forming unit.

6. The information processing method of claim 5, wherein the film forming unit is a coating unit configured to coat a processing liquid on a substrate.

7. The information processing method of claim 6, wherein the first parameter is a rotation speed of the substrate in the coating unit.

8. The information processing method of claim 4, wherein the plurality of second processing units is a heat treatment unit.

9. The information processing method of claim 8, wherein the second parameter is a temperature in the heat treatment unit.

10. The information processing method of claim 1, wherein the substrate characteristic amount is a film thickness.

11. The information processing method of claim 1, wherein the substrate characteristic amount is a line width.

12. An information processing method, comprising:
    an acquisition step of acquiring a data set for each of a plurality of substrates subjected to a first process at a first processing unit of a first substrate processing apparatus and then subjected to a second process at a second processing unit of a second substrate processing apparatus, wherein the first substrate processing apparatus includes a plurality of first processing units configured to perform the first process on a substrate based on a first parameter, which is a process condition of the first process, wherein the second substrate processing apparatus includes a plurality of second processing units configured to perform the second process on the substrate based on a second parameter, which is a process condition of the second process, and wherein the data set includes information specifying the first processing unit at which the first process has been performed, information specifying the second processing unit at which the second process has been performed, and information about a substrate characteristic amount, which is a process result of the first process and the second process; and a calculation step of calculating information including an expected value of the substrate characteristic amount, a unit deviation of the first processing unit with respect to the expected value of the substrate characteristic amount, and a unit deviation of the second processing unit with respect to the expected value of the substrate characteristic amount based on the data set corresponding to each of the plurality of substrates, wherein the unit deviation of the first processing unit corresponds to a deviation from the expected value of the substrate characteristic amount after the first process is performed on the substrate by the first processing unit, and wherein the unit deviation of the second processing unit corresponds to a deviation from the expected value of the substrate characteristic amount of the substrate after the second process is performed on the substrate by the second processing unit.

13. The information processing method of claim 12, wherein the plurality of first processing units is a coating unit configured to coat a processing liquid on a substrate, and
wherein the first parameter is a rotation speed of the substrate in the coating unit.

14. The information processing method of claim 12, wherein the plurality of second processing units is a heat treatment unit, and
wherein the second parameter is a temperature in the heat treatment unit.

15. The information processing method of claim 12, wherein the substrate characteristic amount is a film thickness.

16. The information processing method of claim 12, wherein the substrate characteristic amount is a line width.

17. A substrate processing apparatus, comprising:
a first unit group including a plurality of first processing units configured to perform a first process on a substrate based on a first parameter, which is a process condition of the first process;
a second unit group including a plurality of second processing units configured to perform a second process on the substrate based on a second parameter, which is a process condition of the second process;
a substrate characteristic amount information acquisition part configured to acquire information about characteristics of the substrate subjected to the first process in one of the plurality of first processing units and then subjected to the second process in one of the plurality of second processing units; and
a controller configured to control the plurality of first processing units and the plurality of second processing units,
wherein the controller is configured to execute:
an acquiring step of acquiring a data set for each of a plurality of substrates subjected to the first process in one of the plurality of first processing units and then subjected to the second process in one of the plurality of second processing units from the substrate characteristic amount information acquisition part, wherein the data set includes information specifying the first processing unit at which the first process has been performed, information specifying the second processing unit at which the second process has been performed, and information about a substrate characteristic amount, which is a process result of the first process and the second process; and
a calculation step of calculating information including an expected value of the substrate characteristic amount, a unit deviation of the first processing unit with respect to the expected value of the substrate characteristic amount, and a unit deviation of the second processing unit with respect to the expected value of the substrate characteristic amount based on the data set corresponding to each of the plurality of substrates,
wherein the unit deviation of the first processing unit corresponds to a deviation from the expected value of the substrate characteristic amount after the first process is performed on the substrate by the first processing unit, and
wherein the unit deviation of the second processing unit corresponds to a deviation from the expected value of the substrate characteristic amount of the substrate after the second process is performed on the substrate by the second processing unit.

18. The substrate processing apparatus of claim 17, wherein controller is further configured to calculate, in the calculation step, the information including the unit deviation of the first processing unit with respect to the expected value of the substrate characteristic amount and the unit deviation of the second processing unit with respect to the expected value of the substrate characteristic amount is calculated, based on the data set corresponding to each of the plurality of substrates, by a least square method with a constraint condition in that a norm of the unit deviations of the first processing unit and the second processing unit is minimized.

19. The substrate processing apparatus of claim 17, wherein in the calculation step, when an order of priority in reducing correction values of the first unit group and the second unit group is predetermined for the first unit group and the second unit group, the unit deviations are calculated, based on the data set, sequentially from one of the first unit group and the second unit group, which has a higher priority than the other one of the first unit group and the second unit group, by a least square method with a constraint condition in that a norm of the unit deviation of the first processing unit and a norm of the unit deviation of the second processing unit are minimized sequentially in the predetermined order of priority.

* * * * *

UNITED STATES PATENT AND TRADEMARK OFFICE
CERTIFICATE OF CORRECTION

| | |
|---|---|
| PATENT NO. | : 12,300,526 B2 |
| APPLICATION NO. | : 18/511594 |
| DATED | : May 13, 2025 |
| INVENTOR(S) | : Toyohisa Tsuruda and Yoshitaka Konishi |

Page 1 of 1

It is certified that error appears in the above-identified patent and that said Letters Patent is hereby corrected as shown below:

In the Claims

Claim 18, Column 26, Line 41, please delete the phrase "controller is further configured to calculate".

Signed and Sealed this
Twenty-fourth Day of June, 2025

Coke Morgan Stewart
*Acting Director of the United States Patent and Trademark Office*